US011404532B2

(12) United States Patent
Yin et al.

(10) Patent No.: US 11,404,532 B2
(45) Date of Patent: Aug. 2, 2022

(54) FINGERED CAPACITOR WITH LOW-K AND ULTRA-LOW-K DIELECTRIC LAYERS

(71) Applicant: NXP B.V., San Jose, CA (US)

(72) Inventors: Chunshan Yin, Singapore (SG); Cheong Min Hong, Singapore (SG); Yu Chen, Singapore (SG)

(73) Assignee: NXP B.V., Eindhoven (NL)

( * ) Notice: Subject to any disclaimer, the term of this patent is extended or adjusted under 35 U.S.C. 154(b) by 127 days.

(21) Appl. No.: 16/941,654

(22) Filed: Jul. 29, 2020

(65) Prior Publication Data

US 2020/0357881 A1 Nov. 12, 2020

Related U.S. Application Data

(62) Division of application No. 16/141,950, filed on Sep. 25, 2018, now Pat. No. 10,770,539.

(51) Int. Cl.
*H01L 21/00* (2006.01)
*H01L 49/02* (2006.01)
*H01L 21/3105* (2006.01)
*H01L 23/31* (2006.01)

(52) U.S. Cl.
CPC ........ *H01L 28/60* (2013.01); *H01L 21/31053* (2013.01); *H01L 23/3192* (2013.01)

(58) Field of Classification Search
CPC .............. H01L 28/60; H01L 21/31053; H01L 23/3192
See application file for complete search history.

(56) References Cited

U.S. PATENT DOCUMENTS

| | | | | |
|---|---|---|---|---|
| 5,776,660 A | * | 7/1998 | Hakey | G03F 7/038 430/296 |
| 5,939,766 A | * | 8/1999 | Stolmeijer | H01L 23/5223 257/307 |
| 6,043,146 A | * | 3/2000 | Watanabe | H01L 28/60 438/626 |
| 6,385,033 B1 | * | 5/2002 | Javanifard | H01L 27/0805 257/532 |
| 6,531,777 B1 | | 3/2003 | Woo | |

(Continued)

OTHER PUBLICATIONS

Tuinhout, H., "A test structure to reveal short-range correlation effects of mismatch fluctuations in backend metal fringe capacitors", 2018 International Conference On Microelectronic Test Structures, Mar. 19-22, 2018.

*Primary Examiner* — Laura M Menz

(57) ABSTRACT

An integrated circuit having a fingered capacitor with multiple metal fingers formed in inverted-trapezoid-shaped trenches in a multi-layer structure having a polish stop layer over an ultra-low-K dielectric layer over a low-K dielectric layer over a dielectric cap layer. The ultra-low-K dielectric layer reduces capacitance variations between the fingers, while the polish stop layer prevents metal height variations that would otherwise result from performing CMP directly on the ultra-low-K dielectric layer. The layered structure may include another low-K dielectric layer over the polish stop layer that provides a soft landing for the CMP. The polish stop layer may be removed after the CMP polishing and another ultra-low-K dielectric layer may be formed to encapsulate the tops of the metal fingers in the ultra-low-K dielectric material.

10 Claims, 5 Drawing Sheets

(56) References Cited

U.S. PATENT DOCUMENTS

| | | | |
|---|---|---|---|
| 6,743,671 B2* | 6/2004 | Hu | H01L 28/82 257/E27.048 |
| 6,838,355 B1* | 1/2005 | Stamper | H01L 23/53295 438/428 |
| 7,050,290 B2* | 5/2006 | Tang | H01L 28/60 361/312 |
| 7,417,275 B2* | 8/2008 | Liu | H01L 23/5225 257/E21.011 |
| 7,598,592 B2* | 10/2009 | Chen | H01L 28/60 257/532 |
| 7,656,643 B2* | 2/2010 | Fong | H01L 23/5223 361/313 |
| 8,207,569 B2* | 6/2012 | Bang | H01G 4/38 257/E27.071 |
| 8,847,466 B2* | 9/2014 | Wunnicke | H01L 41/094 310/330 |
| 8,987,862 B2* | 3/2015 | Kastenmeier | H01L 23/5283 257/532 |
| 9,490,165 B2* | 11/2016 | Du | H01L 23/53295 |
| 9,520,461 B1* | 12/2016 | Li | H01L 28/87 |
| 9,627,312 B2* | 4/2017 | Childs | H01L 23/5226 |
| 9,991,332 B2* | 6/2018 | Li | H01L 23/5223 |
| 10,396,030 B2* | 8/2019 | Lee | H01L 28/88 |
| 10,770,539 B2* | 9/2020 | Yin | H01L 28/60 |
| 2002/0038903 A1* | 4/2002 | Tsau | H01L 23/53238 257/532 |
| 2002/0081832 A1* | 6/2002 | Bernstein | H01L 22/22 257/532 |
| 2005/0077581 A1* | 4/2005 | Chang | H01L 23/5222 257/393 |
| 2010/0123213 A1* | 5/2010 | Chen | H01L 23/5225 257/532 |
| 2010/0187587 A1* | 7/2010 | Lun | H01L 28/88 257/E27.098 |
| 2011/0120843 A1* | 5/2011 | Wunnicke | H01L 41/094 200/181 |
| 2015/0262912 A1* | 9/2015 | Ting | H01L 21/76829 438/666 |
| 2017/0062553 A1* | 3/2017 | Li | H01L 23/5226 |
| 2020/0098850 A1* | 3/2020 | Yin | H01L 21/76834 |
| 2021/0265262 A1* | 8/2021 | Hsiao | H01L 21/31144 |

* cited by examiner

320

330

340

200

420

430

440

400

520

530

540

500

440

650

600

FINGERED CAPACITOR WITH LOW-K AND ULTRA-LOW-K DIELECTRIC LAYERS

This application is a divisional application of a U.S. patent application entitled "FINGERED CAPACITOR WITH LOW-K AND ULTRA-LOW-K DIELECTRIC LAYERS", Ser. No. 16/141,950, having a filing date of Sep. 25, 2018, having common inventors, and having a common assignee, all of which is incorporated by reference in its entirety.

BACKGROUND

The present invention relates to semiconductor integrated circuit (IC) fabrication and, more particularly, to fingered capacitors.

Fingered capacitors or fringe capacitors are commonly used in Analog-Mixed Signal (AMS) ICs. FIG. 1 is based on FIG. 1 of U.S. Pat. No. 6,385,033, which is a perspective view of a conventional fingered capacitor 100 having a first capacitor element 120. The first capacitor element 120 includes a positive metal plate 130 and a negative metal plate 140. The positive metal plate 130 has a comb-like structure that includes an elongated end portion 132 having fingers 134 extending perpendicular from the end portion 132. The negative metal plate 140 also has a comb-like structure that includes an elongated end portion 142 having fingers 144 extending perpendicular from the end portion 142. The fingers 134 and 144, which are preferably evenly spaced and have consistent widths and lengths, are inter-digitated (i.e., interleaved) within the same layer of the integrated circuit (IC) die (not shown). A dielectric fills the space between the respective fingers 134 and 144. Deep sub-micron IC manufacturing processes or techniques allow the spacing between the fingers to be close enough such that fringe capacitance between the edges of adjacent fingers within each layer is quite significant. Capacitance has been found to increase as the spacing between the fingers decreases. The newest techniques of forming devices in integrated circuits allow smaller spacing between fingers to generate relatively large amounts of fringe capacitance.

FIG. 2 is a cross-sectional side view of a portion of a conventional fingered capacitor 200, such as the fingered capacitor 100 of FIG. 1, along the perpendicular cut-line AA' of FIG. 1. In particular, FIG. 2 shows three adjacent metal fingers 210 of the fingered capacitor 200, which would typically have one or more additional, equivalent fingers to the left and/or right of the three fingers 200. The three metal fingers 210 in FIG. 2 could correspond to, in FIG. 1, one of the positive-plate fingers 134 located between two negative-plate fingers 144 or one of the negative-plate fingers 144 located between two positive-plate fingers 134. The fingered capacitor 200 can be implemented in one metal layer of a multi-layer integrated circuit having one or more metal layers below the metal layer of the fingered capacitor 200 and/or one or more metal layers above that metal layer, but it is typically replicated across several metal layers in order to get higher fringe capacitance at the same layout area.

As shown in FIG. 2, the fingered capacitor 200 comprises a bottom dielectric cap layer 202 that provides copper passivation and also functions as an etch stop layer. Above the dielectric cap layer 202 is a low-K dielectric layer 204. Located within "inverted-trapezoid-shaped" trenches formed in the low-K dielectric layer 204 are copper traces that form the metal fingers 210. Covering the low-K dielectric layer 204 and the metal fingers 210 is a top dielectric cap layer 212, upon which one or more other metal layers (not shown) may be fabricated.

FIGS. 3A-3D are cross-sectional side views illustrating a conventional process for fabricating the fingered capacitor 200 of FIG. 2. FIG. 3A shows a multi-layer structure 320 having the low-K dielectric layer 204 formed over the dielectric cap layer 202. FIG. 3B shows the structure 330 after trenches 309 have been formed in the low-K dielectric layer 204 of FIG. 3A using conventional photolithography techniques. FIG. 3C shows the structure 340 after (i) the trenches 309 of FIG. 3B have been filled with copper plating and then (ii) chemical-mechanical polishing (CMP) is performed to provide the structure 340 with a flat upper surface. FIG. 3D shows the fingered capacitor 200 formed by applying the top dielectric cap layer 212 over the structure 340 of FIG. 3C.

As should be apparent from above, precision and uniformity across the wafer are the two key requirements of fingered capacitors. However, due to the nature of the Chemical-Mechanical-Polish (CMP) process, the metal thickness is not so easy to control. It would be advantageous to be able to better control the metal thickness.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
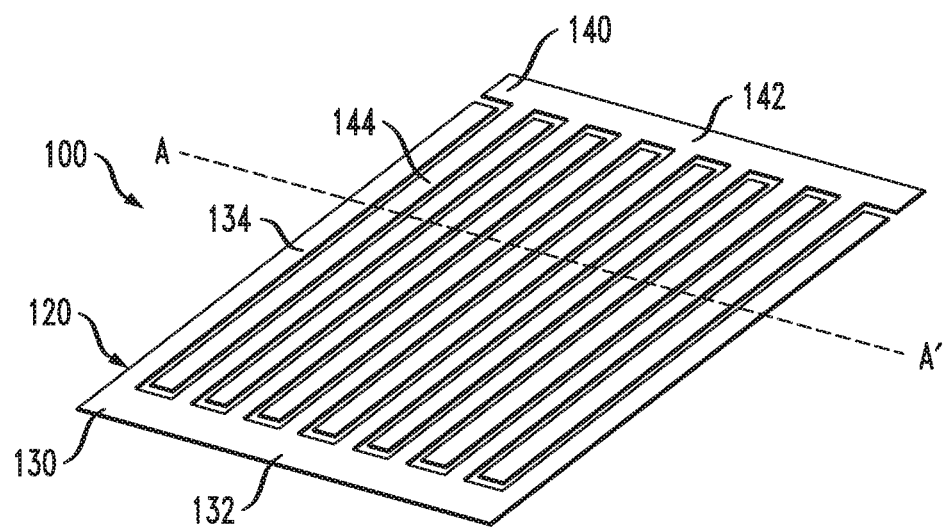
FIG. 1 corresponds to FIG. 1 of U.S. Pat. No. 6,385,033, which is a perspective view of a conventional fingered capacitor.
Figure 2:
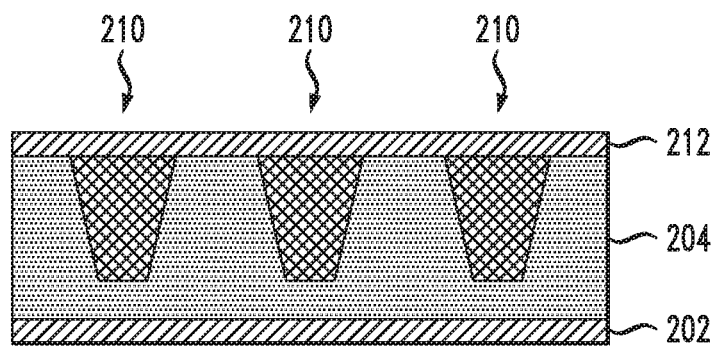
FIG. 2 is a cross-sectional side view of a portion of a conventional fingered capacitor.
Figure 3A:
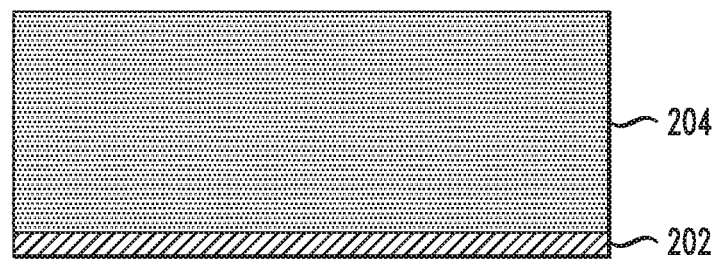
FIGS. 3A-3D are cross-sectional side views illustrating a conventional process for fabricating the fingered capacitor of FIG. 2.
Figure 3B:
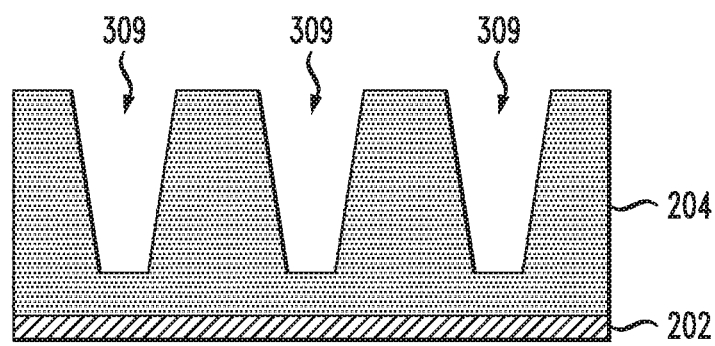
Figure 3C:
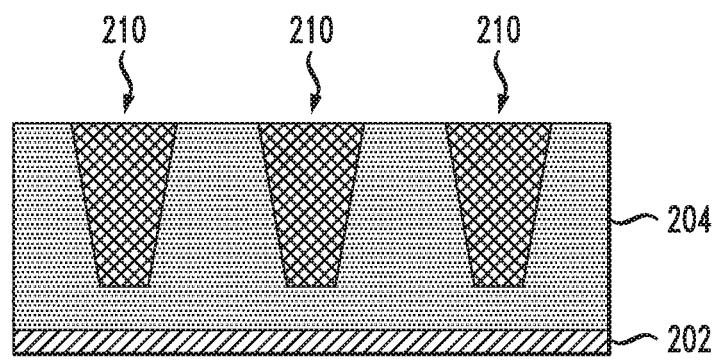
Figure 3D:
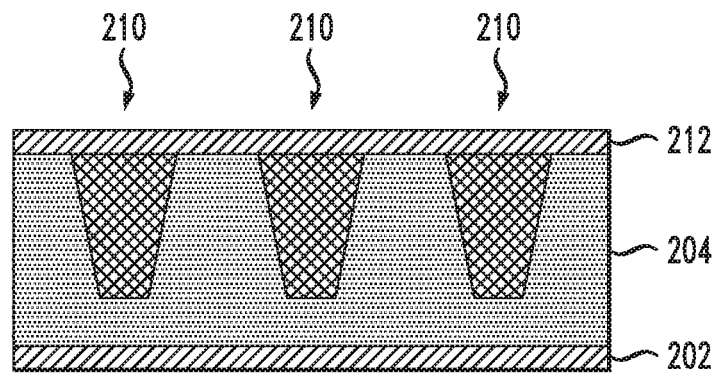

One problem with the architecture of the conventional fingered capacitor 200 of FIG. 2 is the variation in the overall capacitor capacitance level that can exist for different instances of the fingered capacitor 200. The overall capacitance level of a particular instance is a function of the horizontal distances between adjacent fingers 210 in the fingered capacitor 200 and the metal height. Variations in those horizontal distances for different instances of the fingered capacitor 200 or the metal height can result in variations in the overall capacitance level for those different instances.

Due to their inverted-trapezoid shape, the horizontal distance between adjacent metal fingers 210 is shorter at the tops of the metal fingers 210 than at their lower regions. Since shorter distance implies greater fringe capacitance, the contribution to variation in overall capacitance level is greater at the tops of the metal fingers 210 than at their lower regions.

One way to address this capacitance variation issue is to deploy, adjacent to the tops of the inverted-trapezoid-shaped metal fingers, a dielectric material having a relative permittivity (also known as dielectric constant or K value) that is lower than the K value of the dielectric material deployed adjacent to the lower regions of those metal fingers. The lower K value of the dielectric material adjacent to the tops of the metal fingers will reduce the corresponding relative contribution to the overall capacitance level, thereby reducing the magnitude of the variation in the overall capacitance level due to variations in horizontal inter-finger distances for different instances of the fingered capacitor.

One problem with deploying a low-K dielectric material is that the subsequently applied CMP can result in undesirable metal height variation (i.e., deviation of the polished surface from being sufficiently flat). Changing the low-K dielectric to an ultra-low-K dielectric adjacent to the tops of the metal fingers makes the problem even worse. To address this problem, a polish stop layer can be applied over the lower-K dielectric layer prior to CMP, which will typically result in the polished surface having less metal height variation. In some embodiments, at least a portion of the polish stop layer remains in the final fingered capacitor, while, in other embodiments, the entire polish stop layer is removed during the fabrication process.

One aspect of the present invention is an integrated circuit having a plurality of fingers forming a fingered capacitor. The fingered capacitor includes a first dielectric cap layer, a first dielectric layer formed over the dielectric cap layer and having a first K value, and a second dielectric layer formed over the first dielectric layer and having a second K value lower than the first K value. The fingers are formed in the first and second dielectric layers. A second dielectric cap layer is formed over the fingers and the second dielectric layer.

Another aspect of the present invention is a method for fabricating a fingered capacitor. The method includes forming a first dielectric cap layer, and then forming a first dielectric layer having a first K value over the dielectric cap layer. Next a second dielectric layer having a second K value lower than the first K value is formed over the first dielectric layer. Then, the fingers are formed in the first and second dielectric layers. Next, a second dielectric cap layer is formed over the fingers and the second dielectric layer.

FIGS. 4A-4D are cross-sectional side views illustrating a process for fabricating a fingered capacitor 400 according to one embodiment of the present invention.

Figure 4A:
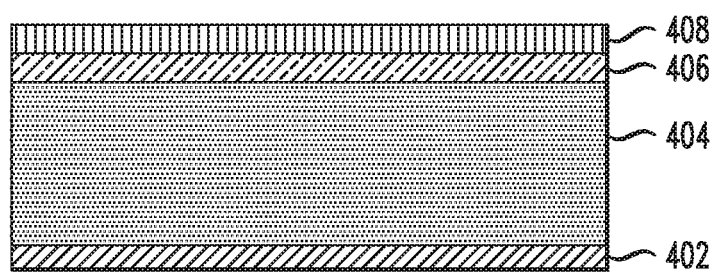
FIGS. 4A-4D are cross-sectional side views illustrating a process for fabricating a fingered capacitor according to one embodiment of the invention.

FIG. 4A shows a multi-layered structure 420 after a low-K dielectric layer 404, then an ultra-low-K dielectric layer 406, and then a polish stop layer 408 are formed over a bottom dielectric cap layer 402. The bottom dielectric cap layer 402 provides metal (e.g., copper) passivation and also functions as an etch stop layer. The bottom dielectric cap layer 402, which has a K value between about 3.0 and about 7.5, may be made of any suitable material, such as (without limitation) SiN, SiCN, aSiC:H, and $SiC_xN_yH_z$. The low-K dielectric layer 404, which has a K value between about 2.5 and about 3.6 and typically about 2.7, may be made of any suitable material, such as (without limitation) SiCOH, p-Si-COH, and Polyarelene (PAE). The ultra-low-K dielectric layer 404, which has a K value of less than about 2.5, may be made of any suitable material, such as (without limitation) Carbon doped $SiO_2$, Parvlene-F, Bezocycloutane (BCB), and Teflon AF. The polish stop layer 408, which has a K value between about 2.5 and about 4.0, may be made of any suitable material, such as (without limitation) SiOC, $SiC_xN_y$, and SiCN:H.

Figure 4B:
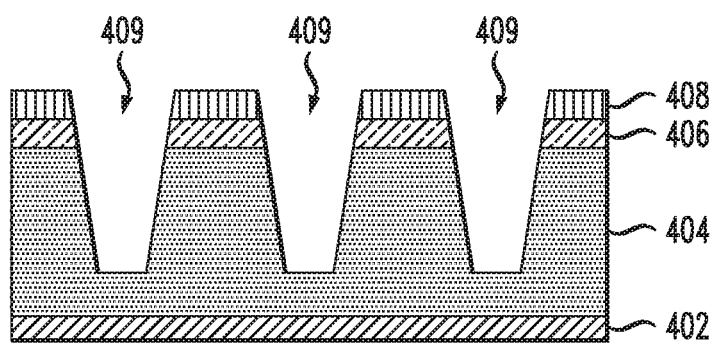

FIG. 4B shows the structure 430 after trenches 409 have been etched into the polish stop layer 408, the ultra-low-K dielectric layer 406, and the low-K dielectric layer 404 of FIG. 4A. Those skilled in the art will know how the trenches 409, as well as the other layers of the fingered capacitor 400, can be formed using conventional photolithography techniques for fabricating integrated circuits.

Figure 4C:
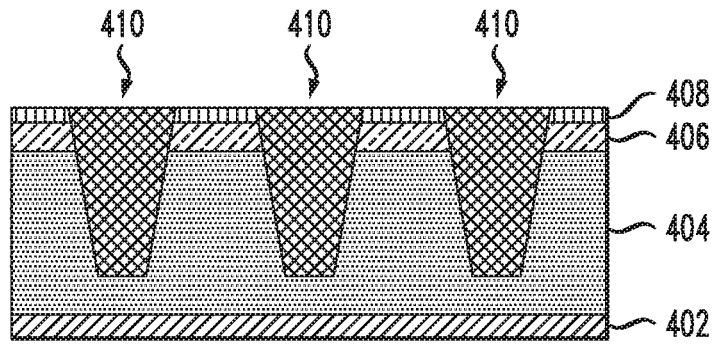

FIG. 4C shows the structure 440 after copper plating and CMP polishing have been performed to fill the trenches 409 of FIG. 4B with copper to form metal fingers 410. Note that the CMP polishing removes only a portion of the polish stop layer 408 in order to provide the structure 440 with a relatively flat upper surface having relatively small metal height variation. Note that, in the structure 440, the top surfaces of the metal fingers 410 are co-planar with the top surface of the polish stop layer 408. Although not shown in the figures, a liner layer is applied to the trenches 409 prior to the copper plating to function as a metal plating seed and a metal barrier layer between the metal fingers 410 and the underlying dielectric 404/406/408.

Figure 4D:
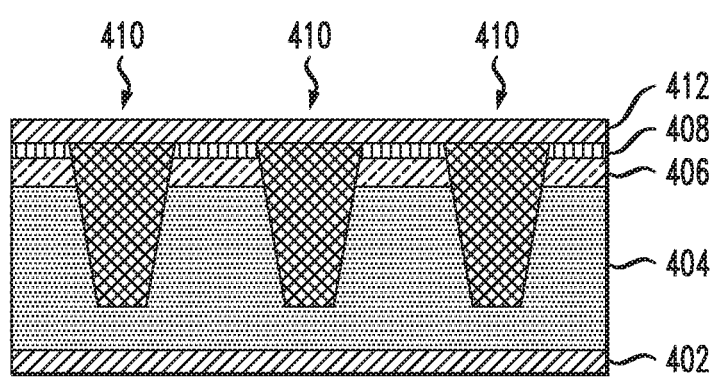

FIG. 4D shows the fingered capacitor 400 formed by applying the top dielectric cap layer 412 over the structure 440 of FIG. 4C. The top dielectric cap layer 412 can be, but does not have to be, formed using the same material as the bottom dielectric cap layer 402. Additional polishing can be applied to the top dielectric cap layer 412 to make the surface flat. Analogous to FIG. 2, FIG. 4D is a cross-sectional view of a portion of the fingered capacitor 400 corresponding to three adjacent fingers 410. Here, too, there may be one or more metal layers below and/or one or more metal layers above the metal layer in which the fingered capacitor 400 is formed.

In fabricating the fingered capacitor 400, the low-K dielectric layer 404 is formed directly over the bottom dielectric cap layer 402, the ultra-low-K dielectric layer 406 is formed directly over the low-K dielectric layer 404, the polish stop layer 408 is formed directly over the ultra-low-K dielectric layer 406, and the top dielectric cap layer 412 is formed directly over the polish stop layer 408. In alternative implementations, there may be one or more suitable intervening layers between one or more of these different layer pairs. Such layer(s) can enhance adhesion and/or mechanical strength.

FIGS. 5A-5D are cross-sectional side views illustrating a process for fabricating a fingered capacitor 500 according to another embodiment of the invention.

Figure 5A:
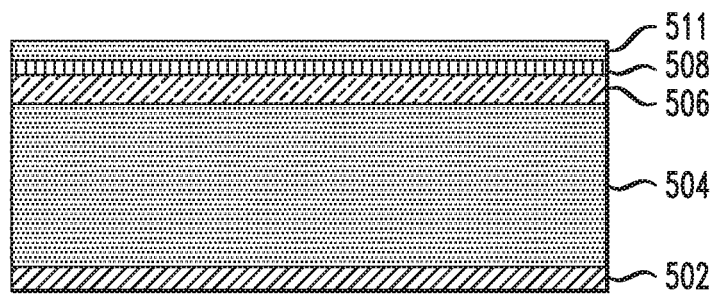
FIGS. 5A-5D are cross-sectional side views illustrating a process for fabricating a fingered capacitor according to another embodiment of the invention.

FIG. 5A shows a multi-layer structure 520 after a first low-K dielectric layer 504, then an ultra-low-K dielectric layer 506, then a polish stop layer 508, and then a second low-K dielectric layer 511 are formed over a bottom dielectric cap layer 502. The bottom dielectric cap layer 402, the first low-K dielectric layer 504, the ultra-low-K dielectric layer 506, and the polish stop layer 508 can be, but do not have to be, made of the same materials as the corresponding layers in the fingered capacitor 400 of FIG. 4D. The second low-K dielectric layer 511 can be, but does not have to be, made of the same material as the first low-K dielectric layer 504.

Figure 5B:
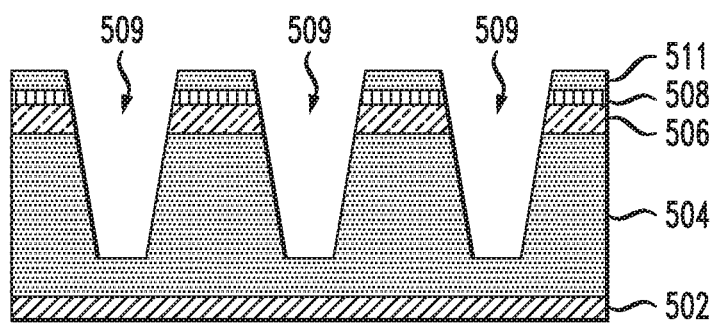

FIG. 5B shows the structure 530 after trenches 509 have been etched into the second low-K dielectric layer 511, the polish stop layer 508, the ultra-low-K dielectric layer 506, and the first low-K dielectric layer 504 of FIG. 5A. Those skilled in the art will know how the trenches 509, as well as the other layers of the fingered capacitor 500, can be formed using conventional photolithography techniques for fabricating integrated circuits.

Figure 5C:
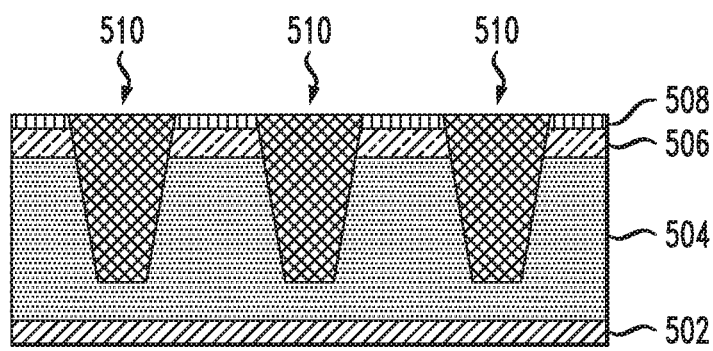

FIG. 5C shows the structure 540 after copper plating and CMP polishing have been performed to fill the trenches 509 of FIG. 5B with copper to form metal fingers 510. Note that the CMP polishing removes all of the second low-K dielectric layer AJ and little if any of the polish stop layer 508 in order to provide the structure 540 with a relatively flat upper surface having relatively small metal height variation. The second low-K dielectric layer AJ, which is typically made of a material that is softer than the material of the polish stop layer 508, provides a "soft landing" for better process control during the CMP polishing step and can enable less material to be used for the polish stop layer 508. Although not shown in the figures, a liner layer is applied to the trenches 509 prior to the copper plating to function as a metal plating seed and a metal barrier layer between the metal fingers 510 and the underlying dielectric 504/506/508/511. Note that, in the structure 540, the top surfaces of the metal fingers 510 are co-planar with the top surface of the polish stop layer 508. Note also that the structure 540 is substantially identical to the structure 440 of FIG. 4C.

Figure 5D:
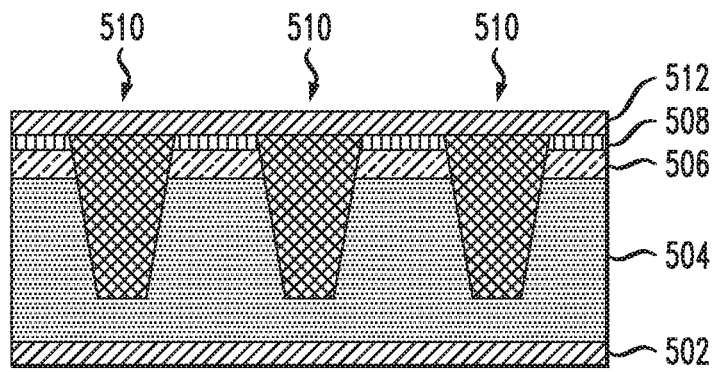

FIG. 5D shows the fingered capacitor 500 formed by applying the top dielectric cap layer 512 over the structure 540 of FIG. 5C. The top dielectric cap layer 512 can be, but does not have to be, formed using the same material as the bottom dielectric cap layer 502. Additional polishing can be applied to the top dielectric cap layer 512 to make the surface flat. Analogous to FIG. 2, FIG. 5D is a cross-sectional view of a portion of the fingered capacitor 500 corresponding to three adjacent fingers 510. Here, too, there may be one or more metal layers below and/or one or more metal layers above the metal layer in which the fingered capacitor 500 is formed. Note that the structure of the fingered capacitor 500 is substantially identical to the structure of the fingered capacitor 400 of FIG. 4C.

In fabricating the fingered capacitor 500, the first low-K dielectric layer 504 is formed directly over the bottom dielectric cap layer 502, the ultra-low-K dielectric layer 506 is formed directly over the first low-K dielectric layer 504, the polish stop layer 508 is formed directly over the ultra-low-K dielectric layer 506, the second low-K dielectric layer 511 is formed directly over the polish stop layer 508, and, after the second low-K dielectric layer 511 is completely removed during the CMP polishing, the top dielectric cap layer 512 is formed directly over the remaining polish stop layer 508. In alternative implementations, there may be one or more suitable intervening layers between one or more of these different layer pairs. Such layer (s) can enhance adhesion and/or mechanical strength.

Figure 6A:
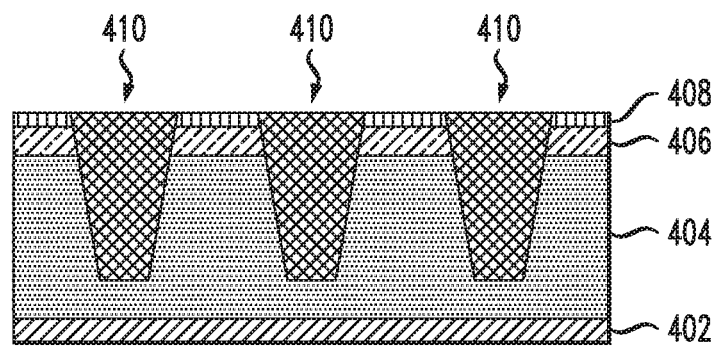
FIGS. 6A-6C are cross-sectional side views illustrating a process for fabricating a fingered capacitor according to yet another embodiment of the invention.
Figure 6B:
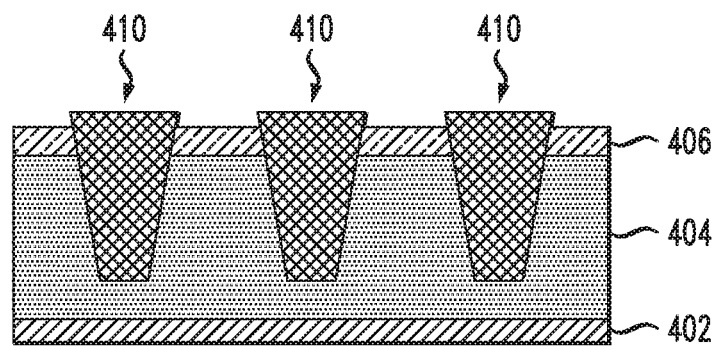
Figure 6C:
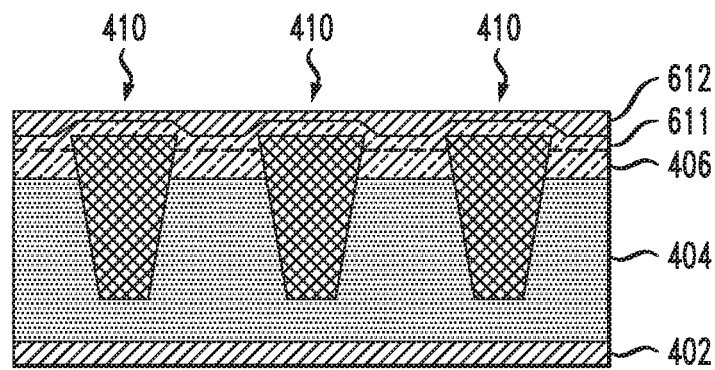

FIGS. 6A-6C are cross-sectional side views illustrating a process for fabricating a fingered capacitor 600 according to yet another embodiment of the invention. The process of FIGS. 6A-6C can begin with either the structure 440 of FIG. 4C or the similar structure 540 of FIG. 5C. The following discussion is based on the process of FIGS. 6A-6C beginning with the structure 440 of FIG. 4C. Those skilled in the art will understand how to perform an analogous process beginning with the similar structure 540 of FIG. 5C.

FIG. 6A shows the structure 440 of FIG. 4C formed as described above in the context of FIGS. 6A-6C.

FIG. 6B shows the structure 650 formed by etching away the remaining material of the polish stop layer 408 of FIG. 6A. Note that, in the structure 650, the top surfaces of the metal fingers 410 extend above the top surface of the (first) ultra-low-K dielectric layer 406.

FIG. 6C shows the fingered capacitor 600 formed by applying a second ultra-low-K dielectric layer 611 and a top dielectric cap layer FI over the structure 650 of FIG. 6B. The second ultra-low-K dielectric layer 611 may be formed using the same material as the first ultra-low-K dielectric layer 406, and the top dielectric cap layer 612 can be, but does not have to be formed using the same material as the bottom dielectric cap layer 502. The second ultra-low-K dielectric layer 611 can further reduce overall capacitance variations by completely encapsulating the tops of the metal fingers 410 with ultra-low-K dielectric material. Additional polishing can be applied to the top dielectric cap layer 612 to make the surface flat. Analogous to FIGS. 2 and 3, FIG. 6C is a cross-sectional view of a portion of the fingered capacitor 600 corresponding to three adjacent fingers 510. Here, too, there may be one or more metal layers below and/or one or more metal layers above the metal layer in which the fingered capacitor 600 is formed.

In fabricating the fingered capacitor 600, the low-K dielectric layer 404 is formed directly over the bottom dielectric cap layer 402, the first ultra-low-K dielectric layer 406 is formed directly over the low-K dielectric layer 404, the polish stop layer 408 is formed directly over the first ultra-low-K dielectric layer 406, after the polish stop layer 408 has been completely removed, the second ultra-low-K dielectric layer 611 is formed directly over the first ultra-low-K dielectric layer 406, and the top dielectric cap layer 612 is formed directly over the second ultra-low-K dielectric layer 611. In alternative implementations, there may be one or more suitable intervening layers between one or more of these different layer pairs. Such layer(s) can enhance adhesion and/or mechanical strength.

It should be apparent to those skilled in the art that the present invention provides a method or fabricating a fingered capacitor that employs a polish stop layer to control the metal thickness. The trench is normally designed as inverted trapezoid shape for easy trench etch and metal plating, which gives shorter top metal space than that of bottom metal. An ultra-low-K dielectric is introduced at the top metal position to control any extra variation there. The method allows for high precision and high uniformity fringe capacitors with little process add-on.

In the present invention, the polish stop layer can reduce metal height variation from CMP. The ultra-low-K material at the top part can reduce any extra variation caused by inverted trapezoid metal shape, and the extra ultra-low-K material re-deposition can further reduce any variation caused by inverted trapezoid metal shape.

The present invention may be embodied in many other specific forms without departing from the spirit or scope of the invention. Particularly, it should be understood that the present invention may be embodied in the following forms.

Although the invention has been described in the context of embodiments having a second dielectric layer with an ultra-low K value formed over a first dielectric layer with a low K value, in general, it may be sufficient for the K value or the second dielectric layer to be smaller than the K value of the first dielectric layer, whether or not those two layers have ultra-low and low K values, respectively.

Although the invention has been described in the context of metal fingers formed of copper, those skilled in the art will understand that the fingers can be formed using other suitable metals or even other suitable non-metallic conductors.

Although the invention has been described in the context of methods for fabricating various embodiments in which CMP polishing is applied at certain steps. Those skilled in the art will understand that other suitable processes may be employed other than CMP polishing during some of those steps, such as wet or dry etching processes.

The present examples and embodiments are to be considered as illustrative and not restrictive, and the invention is not to be limited to the details given herein, but may be modified within the scope and equivalence of the appended claims.

What is claimed is:

1. A method for fabricating a fingered capacitor comprising a plurality of fingers in an integrated circuit, the method comprising:
    forming a first dielectric cap layer;
    forming a first dielectric layer over the dielectric cap layer and having a first K value;
    forming a second dielectric layer over the first dielectric layer and having a second K value lower than the first K value;
    forming the fingers in the first and second dielectric layers;
    forming a second dielectric cap layer over the fingers and the second dielectric layer; and
    forming a third dielectric layer over the second dielectric layer and the fingers, the second dielectric cap layer formed over the third dielectric layer.

2. The method of claim 1, wherein the third dielectric layer has a third K value equal to the second K value of the second dielectric layer.

3. The method of claim 1, wherein the first dielectric layer is formed directly over the first dielectric cap layer, and wherein the second dielectric layer is formed directly over the first dielectric layer.

4. The method of claim 1, wherein the third dielectric layer is formed directly over the second dielectric layer, and wherein the second dielectric cap layer is formed directly over the third dielectric layer.

5. The method of claim 1, further comprising:
    before the fingers are formed, forming a polish stop layer over the second dielectric layer, wherein the fingers are also formed in the polish stop layer.

6. The method of claim 5, wherein the polish stop layer is formed directly over the second dielectric layer.

7. The method of claim 5, wherein the second dielectric cap layer is formed directly over the polish stop layer.

8. A method for fabricating a fingered capacitor comprising a plurality of fingers in an integrated circuit, the method comprising:
    forming a first dielectric cap layer;
    forming a first dielectric layer over the dielectric cap layer and having a first K value;
    forming a second dielectric layer over the first dielectric layer and having a second K value lower than the first K value;
    forming the fingers in the first and second dielectric layers;
    forming a second dielectric cap layer over the fingers and the second dielectric layer; and
    forming a third dielectric layer over the second dielectric layer and the fingers, the second dielectric cap layer formed directly over the third dielectric layer.

9. The method of claim 8, wherein the first dielectric layer is formed directly over the first dielectric cap layer, and wherein the second dielectric layer is formed directly over the first dielectric layer.

10. The method of claim 8, wherein the third dielectric layer has a third K value equal to the second K value of the second dielectric layer.

* * * * *